United States Patent
Chen et al.

(10) Patent No.: US 8,564,305 B2
(45) Date of Patent: Oct. 22, 2013

(54) DISCONTINUOUS TYPE LAYER-ID DETECTOR FOR 3D-IC AND METHOD OF THE SAME

(75) Inventors: Ming-Pin Chen, Kaohsiung County (TW); Meng-Fan Chang, Taichung (TW); Wei-Cheng Wu, Hsinchu (TW)

(73) Assignee: National Tsing Hua University, Hsinchu (TW)

(*) Notice: Subject to any disclaimer, the term of this patent is extended or adjusted under 35 U.S.C. 154(b) by 359 days.

(21) Appl. No.: 12/820,953

(22) Filed: Jun. 22, 2010

(65) Prior Publication Data

US 2011/0309843 A1 Dec. 22, 2011

(51) Int. Cl.
*G01R 31/02* (2006.01)
(52) U.S. Cl.
USPC ............ 324/537; 324/73.1; 324/76.11
(58) Field of Classification Search
USPC ............... 324/500, 537, 73.1, 76.11
See application file for complete search history.

(56) References Cited

U.S. PATENT DOCUMENTS

| 7,969,193 B1* | 6/2011 | Wu et al. | 326/82 |
| 2007/0126105 A1* | 6/2007 | Yamada et al. | 257/686 |

* cited by examiner

*Primary Examiner* — Vincent Q Nguyen
(74) *Attorney, Agent, or Firm* — Chih Feng Yeh; Huntington IP Consulting Co., Ltd

(57) ABSTRACT

A 3D-IC detector for each layer of a stacked device with N layer, includes a dividing-two circuit coupled to a (N−1) signal; a first comparator is coupled to the dividing-two circuit, wherein an input A is coupled to an initial layer number signal, an input B of the first comparator is coupled to an output of the dividing-two circuit; a second comparator is coupled to the initial layer number by an input A of the second comparator, and a num is coupled to an input B of the second comparator; a first Add/sub circuit is coupled to the num via an input A of the first Add/sub circuit, and coupled to the first comparator via an input B of the first Add/sub circuit, to the second comparator via an input +/− signal of the first Add/sub circuit; and a second Add/sub circuit coupled to the first comparator via an input A of the second Add/sub circuit, to the num via an input B of the second Add/sub circuit.

17 Claims, 3 Drawing Sheets

DISCONTINUOUS TYPE LAYER-ID DETECTOR FOR 3D-IC AND METHOD OF THE SAME

TECHNICAL FIELD

The present invention generally relates to a 3D stacked chip device, and especially to a discontinuous type layer-ID detector for 3D-IC.

RELATED ART

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3-D stacked devices. It is a technology where vertical interconnects are formed through the wafer to enable communication among the stacked chips. One of the related article may refer to IEEE, JOURNAL OF SOLID-STATE CIRCUITS, VOL. 45, NO. 1, JANUARY 2010, entitled: "8 Gb 3-D DDR3 DRAM Using Through-Silicon-Via Technology". In the article, a 3-D DRAM with TSVs is proposed which overcomes the limits of conventional module approaches. It also discloses how the architecture and data paths were designed. 3-D technologies including TSV connectivity check and repair scheme, and power noise reduction method are also disclosed. TSVs can be formed simply after fab-out so that no special process integration during the normal process flow is required. Chip identification (ID) is typically assigned.

After the same or different chips are stacked to form a three dimension chip, in order to select a desired chip among plural chip of 3D-IC device to operate, when the system operate, every chip of 3D-IC device have to be identified a layer-ID (layer identification number) to select the designated chip to operate. Many methods for identifying a layer-ID are proposed in the past, however, that is not only to increase the cost, but still not to overcome the problem that the more stacked chips of 3D-IC device, the more electrodes. For instance, ELPIDA MEMORY INC. disclosed a Stacked type semiconductor memory device and chip selection circuit and the publication number is 20070126105. It provides a stacked type semiconductor memory device in which when selecting a desired semiconductor chip among a plurality of stacked semiconductor chips, a plurality of chip identification numbers different from each other can be automatically generated by a plurality of operation circuits connected in cascade, and the desired semiconductor chip can be reliably selected by a unique identification number assigned to each semiconductor chip using the semiconductor chips having the same structure without employing a complicated structure or particular control. In the prior art, a calculated output of an increment circuit of a last stage among M increment circuits connected in cascade may be used to determine the number M of the semiconductor chips. By this, when the number of stacked type semiconductor devices is unknown, the correct number of semiconductor chips can be reliably recognized. A further prior art U.S. Pat. No. 7,494,846 is disclosed by Taiwan Semiconductor Manufacturing Company, Ltd., filed on Mar. 9, 2007. It disclosed a semiconductor structure including a first semiconductor die and a second semiconductor die identical to the first semiconductor die. The first semiconductor die includes a first identification circuit; and a first plurality of input/output (I/O) pads on the surface of the first semiconductor die. The second semiconductor die includes a second identification circuit, wherein the first and the second identification circuits are programmed differently from each other; and a second plurality of I/O pads on the surface of the second semiconductor die. Each of the first plurality of I/O pads is vertically aligned to and connected to one of the respective second plurality of I/O pads. The second semiconductor die is vertically aligned to and bonded on the first semiconductor die.

The present invention provides a novel method for 3D-IC identify.

SUMMARY

An aspect of the present invention is to provide a method and a scheme of a discontinuous type detector for 3D IC stacked device.

A 3D-IC detector for each layer of a stacked device with N layers, includes a dividing-two circuit coupled to a (N−1) signal; a first comparator is coupled to the dividing-two circuit, wherein an input A is coupled to an initial layer number signal, an input B of the first comparator is coupled to an output of the dividing-two circuit; a second comparator is coupled to the initial layer number by an input A of the second comparator, and a num is coupled to an input B of the second comparator. A first Add/sub circuit is coupled to the num via an input A of the first Add/sub circuit, and is coupled to the first comparator via an input B of the first Add/sub circuit, to the second comparator via an input +/− signal of the first Add/sub circuit. A second Add/sub circuit is coupled to the first comparator via an input A of the second Add/sub circuit, to the num via an input B of the second Add/sub circuit.

An output of the first comparator is zero while the input A of the first comparator is equal to the input B of the first comparator; an output of the first comparator is one while the input A of the first comparator is not equal to the input B of the first comparator.

The detector further includes a plus-one circuit coupled between the initial layer number signal and next stage initial layer number.

An output of the second comparator is zero while the input A of the second comparator is not equal to the input B of the second comparator. An output of the second comparator is one while the input A of the second comparator is equal to the input B of the second comparator. An input +/− signal of the second Add/sub circuit is coupled to an output +/− signal of the second comparator. The output of the first Add/sub circuit is (A+B) while the input +/− signal is one; on the contrary, an output of the first Add/sub circuit is (A−B) while the input +/− signal is zero. An input +/− of the second Add/sub circuit is coupled to the output +/− signal of the second comparator. The output of the second Add/sub circuit is (A+B) while the input +/− signal is one; the output of the second Add/sub circuit is (A−B) while the input +/− signal is zero. Finally, a layer ID is output from the second Add/sub circuit.

A method of detecting a layer ID for 3D-IC for each layer of a stacked device with N layer includes a step of generating an initial layer number by a detector of the each layer from zero to (N−1) gradually, followed by assigning a num for the each layer by N/2, and followed by taking a quotient as the num for the each layer by gradually increasing from zero to quotient, followed by gradually decreasing from the quotient to zero by the detector, respectively. A "+/−" is assigned to the each layer based on the num and the initial layer number by the detector. A layer ID is generated for the each layer accordingly based on the num, the initial layer number and the "+/−" by the detector.

Table 1 and Table 2 show the examples according to the present invention.

TABLE 1

| layer | num | sign | Layer-id |
|-------|-----|------|----------|
| 0 | 0 | + | 0 |
| 1 | 1 | + | 2 |
| 2 | 2 | + | 4 |
| 3 | 2 | − | 1 |
| 4 | 1 | − | 3 |
| 5 | 0 | − | 5 |

TABLE 2

| layer | num | sign | Layer-id |
|-------|-----|------|----------|
| 0 | 0 | + | 0 |
| 1 | 1 | + | 2 |
| 2 | 2 | + | 4 |
| 3 | 3 | + | 6 |
| 4 | 4 | + | 8 |
| 5 | 4 | − | 1 |
| 6 | 3 | − | 3 |
| 7 | 2 | − | 5 |
| 8 | 1 | − | 7 |

DETAILED DESCRIPTION

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Figure 1:
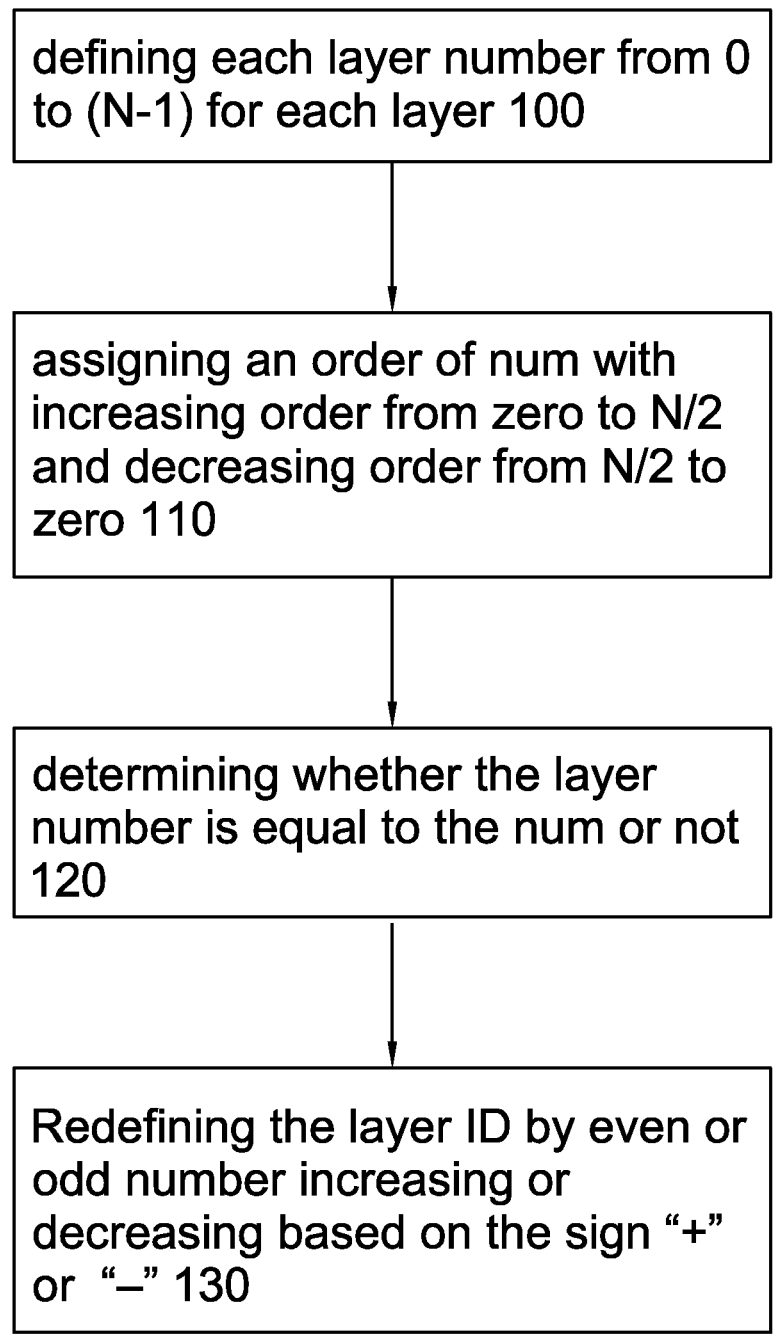
FIG. 1 shows a flow chart of the embodiment of the ID detector according to the present invention.

Please refer to FIG. 1 and Table 1, the method of the detecting the layer ID includes a step 100 of defining each initial layer number from 0 to (N−1) for each layer by an add-one circuit of each layer while the stacked device with N layers of chips. Please refer to Table 1, column one indicates the layer number for each layer. If the stacked device has six layers of chips, then the initial layer number is from 0-5 for each layer, respectively. Subsequently, the detector assigns an order of num with gradually increasing one from zero to N/2 (taking the quotient and leaving alone the remainder) and subsequently decreasing one from N/2 to zero in step 110. For example, from the Table one, the initial layer number is 0-5. Then, the N is 5, and the num for each layer is gradually increasing from 0 to N/2, and followed by gradually decreasing from N/2 to zero, accordingly. The sequent can be reverse. Namely, the increasing one order is from zero to 2 (5/2=2+½; taking the number 2); the decreasing one order is from 2 to zero. The num order may refer to col. 2 of Table 1, the num is 0, 1, 2, 2, 1, 0, respectively.

The next step 120 is to determine whether the initial layer number is equal to the num or not. If the initial layer number is equal to the num, then the detector assigns "+" to the layer, otherwise, assigns "−" to the layer. The task can be done by an add/sub device which will be described later in FIG. 2 and FIG. 3. Subsequently, the detector 200 redefines (step 130) the layer ID by gradually increasing (or decreasing) even and odd numbers based on the sign "+" or "−", thereby separating the layer ID with two groups including an odd number group and a even number group, turning to the col. 4 of Table 1. In one example, the layer ID is 0, 2, 4, 1, 3, 5. The type of layer ID refers to discontinuous type layer ID. Table 2 is another example with layer number from zero to 8, while the stacked device with 9 layers of chips. N is 8, and the num is gradually increased from 0 to 4, and followed by gradually decreasing from 4 to 1. Accordingly, the layer ID is separated with even number group 0, 2, 4, 6, 8, and odd number group 1, 3, 5, 7.

Figure 2:
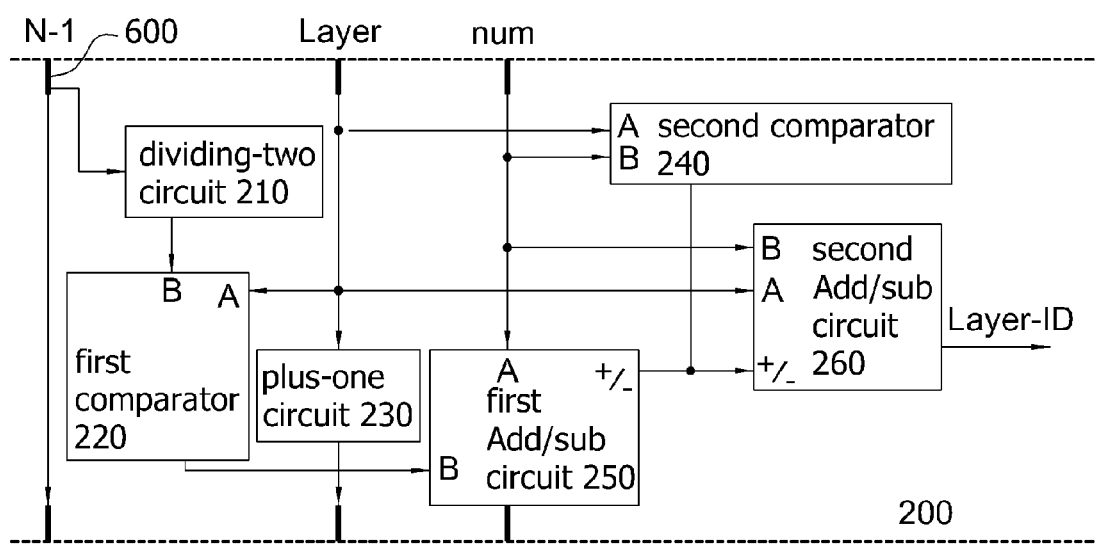
FIG. 2 shows the functional diagram of the detector of the present invention.

FIG. 2 illustrates the preferred embodiment of the detector for each layer N of the stacked device. The detector 200 includes a dividing-two circuit 210 coupled to a (N−1) signal. A first comparator 220 is coupled to the dividing-two circuit 210 through input B of the first comparator 220 and its' input A is coupled to the layer signal (N−1). The output of the first comparator 220 is zero while the input A is equal to the input B. On the contrary, the output of the first comparator 220 is one while the input A is not equal to the input B. A plus-one circuit 230 is coupled between an initial layer number of this stage and the initial layer number of next (or previous) stage. The initial number of next layer will be more than one to the one of the current stage by the plus-one circuit 230.

A second comparator 240 is coupled to the initial layer number by input A and the num via the input B of the second comparator 240. The function of the second comparator 240 is to determine the sign of "+" or "−" to each corresponding layer based on the input from the num and initial layer number. The output of the second comparator 240 is zero while the input A is not equal to the input B. On the other hand, the output of the second comparator 220 is one while the input A is equal to the input B.

Next, a first Add/sub circuit 250 is coupled to the num via an input A, and coupled to the first comparator 220 via an input B, and is coupled to the second comparator 240 via a third input "+/−". The input "+/−" terminal of the first Add/sub circuit 250 is coupled to the output signal from the second comparator 240. The output of the first Add/sub circuit 250 is (A+B) while the input "+/−" is one. On the contrary, the output of the Add/sub circuit 250 is (A−B) while the input "+/−" is zero. The first Add/sub circuit 250 is used to determine the (A+B) or (A−B) depending on the input signals from num and the output of the first comparator 220. To phrase another way, the add/sub signal will be designed by the first Add/sub circuit 250 based on the inputs of num, the first comparator 220 and the second comparator 240.

A second Add/sub circuit 260 is coupled to the first comparator 220 via a first input A, coupled to the num via a second input B of the second Add/sub circuit 260. Further, the third input "+/−" of the second Add/sub circuit 260 is coupled to the output "+/−" signal of the second comparator 240. The output of the second Add/sub circuit 260 is (A+B) while the input "+/−" is one. On the contrary, the output of the Add/sub circuit 250 is (A−B) while the input "+/−" is zero. The layer ID will be output from the second Add/sub circuit 260. Thus, the second Add/sub circuit 260 is employed to determine the ID for each corresponding layer based on the inputs of initial layer number, num and the "+/−" from the second comparator 240.

Figure 3:
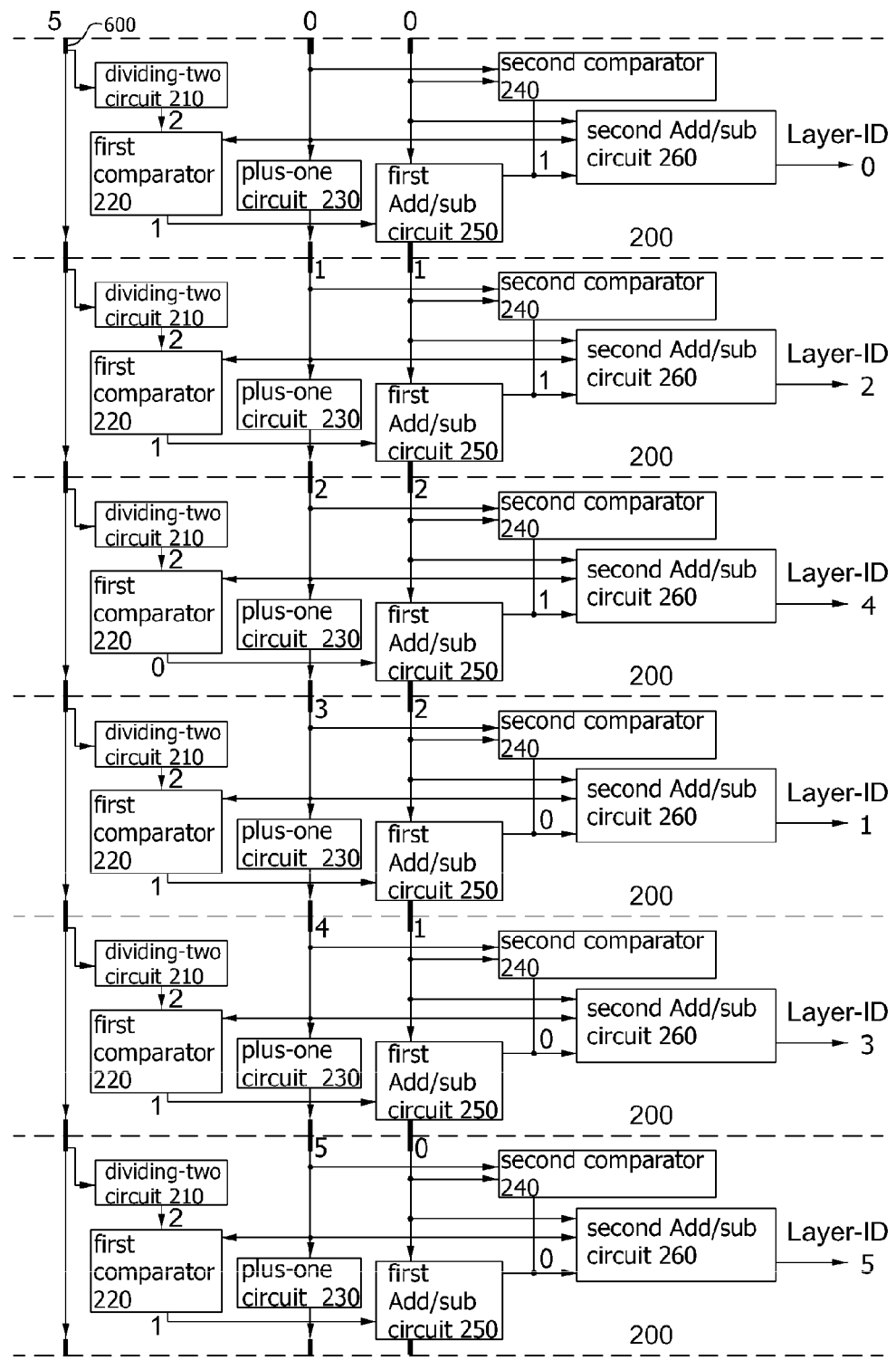
FIG. 3 shows the functional diagram of the stacked device with six layers of the present invention.

By employing the detector set by FIG. 2 and the method in FIG. 1, the layer ID will be defined, accordingly. FIG. 3 is the example of a stacked device with six layers. The uppermost layer, for instant, the initial layer number (N−1) is 5 which will be fed into the dividing-two circuit 210, and the output will be 2. The num will be zero which can be found in table one, and the initial layer number is zero as well. The output of the first compactor 220 will be one due to the input of A is 2 and the input B is zero, and A is not equal B. However, the output of the second compactor 240 will be one due to the input of A is equal to input B. The communication traces 600 for each layer could be formed by TSVs.

The inputs A, B, "+/−" of the first Add/sub circuit 250 is respectively 0, 1, 1, therefore, the output of the first Add/sub circuit 250 will be 1. Similarly, the inputs A, B, "+/−" of the second Add/sub circuit 260 is respectively 0, 0, 1, therefore, the output of the second Add/sub circuit 260 will be 0 which is the layer ID of the current layer.

By using the same scheme, the layer and num of next layer will be one, and the output of the second Add/sub circuit 260 of next layer will be 2 which is the layer ID of the next layer by operating the above mentioned method. The other layer ID can be achieved by the same way. The redundancy illustration is therefore omitted.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A 3D-IC detector for each layer of a stacked device with N layers, comprising:
   a dividing-two circuit coupled to a (N−1) signal;
   a first comparator coupled to said dividing-two circuit, wherein an input A is coupled to an initial layer number signal, an input B of said first comparator is coupled to an output of said dividing-two circuit;
   a second comparator coupled to said initial layer number signal by an input A of said second comparator, and a num is coupled to an input B of the second comparator;
   a first Add/sub circuit coupled to said num via an input A of said first Add/sub circuit, and coupled to said first comparator via an input B of said first Add/sub circuit, to said second comparator via an input "+/−" signal of said first Add/sub circuit; and
   a second Add/sub circuit coupled to said first comparator via an input A of said second Add/sub circuit, to said num via an input B of said second Add/sub circuit;
   wherein said detector redefines a layer ID by gradually increasing or decreasing even and odd numbers based on said input "+/−" signal, thereby separating said layer ID with two groups to form discontinuous type layer ID.

2. The 3D-IC detector according to claim 1, wherein an output of said first comparator is zero while said input A of said first comparator is equal to said input B of said first comparator.

3. The 3D-IC detector according to claim 1, wherein an output of said first comparator is one while said input A of said first comparator is not equal to said input B of said first comparator.

4. The 3D-IC detector according to claim 1, further comprising a plus-one circuit coupled between said initial layer number signal and next stage initial layer number.

5. The 3D-IC detector according to claim 1, wherein an output of said second comparator is zero while said input A of said second comparator is not equal to said input B of said second comparator.

6. The 3D-IC detector according to claim 1, wherein an output of said second comparator is one while said input A of said second comparator is equal to said input B of said of said second comparator.

7. The 3D-IC detector according to claim 1, wherein an input "+/−" signal of said second Add/sub circuit is coupled to an output "+/−" signal of said first Add/sub circuit.

8. The 3D-IC detector according to claim 1, wherein an output of said first Add/sub circuit is (A+B) while said input "+/−" signal is one.

9. The 3D-IC detector according to claim 1, wherein an output of said first Add/sub circuit is (A−B) while said input "+/−" signal is zero.

10. The 3D-IC detector according to claim 1, wherein an output of said second Add/sub circuit is (A+B) while said input "+/−" signal is one.

11. The 3D-IC detector according to claim 1, wherein an output of said second Add/sub circuit is (A−B) while said input "+/−" signal is zero.

12. The 3D-IC detector according to claim 1, wherein a layer ID is output from said second Add/sub circuit.

13. A method of detecting a layer ID for 3D-IC for each layer of a stacked device with N layers, comprising:
generating an initial layer number by a detector of said each layer from zero to (N−1) gradually;
assigning a num for said each layer by N/2, and followed by taking a quotient as said num for said each layer by gradually increasing from zero to quotient, followed by gradually decreasing from said quotient to zero by said detector, respectively;
assigning "+/−" to said each layer based on said num and said initial layer number by said detector; and
generating a layer ID for said each layer based on said num, said initial layer number and said "+/−" by said detector, wherein said detector redefines said layer ID by gradually increasing or decreasing even and odd numbers based on said "+/−", thereby separating said layer ID with two groups to form discontinuous type layer ID.

14. The method according to claim 13, wherein said two groups includes an even number group and an odd number group.

15. The method according to claim 13, wherein said detector includes a dividing-two circuit coupled to a (N−1) signal; a first comparator coupled to said dividing-two circuit, wherein an input A is coupled to said initial layer number signal, an input B of said first comparator is coupled to an output of said dividing-two circuit; a second comparator coupled to said initial layer number signal by an input A of said second comparator, and said num is coupled to an input B of the second comparator; a first Add/sub circuit coupled to said num via an input A of said first Add/sub circuit, and coupled to said first comparator via an input B of said first Add/sub circuit, to said second comparator via an input "+/−" signal of said first Add/sub circuit; and a second Add/sub circuit coupled to said first comparator via an input A of said second Add/sub circuit, to said num via an input B of said second Add/sub circuit.

16. The method according to claim 15, wherein said "+/−" for said each layer is determined by said second comparator.

17. The method according to claim 15, wherein said layer ID for said each layer is determined by said second Add/sub circuit.

* * * * *